United States Patent
Theuss

(10) Patent No.: US 8,900,715 B2
(45) Date of Patent: Dec. 2, 2014

(54) SEMICONDUCTOR DEVICE

(75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 1447 days.

(21) Appl. No.: 12/137,328

(22) Filed: Jun. 11, 2008

(65) Prior Publication Data

US 2009/0309191 A1  Dec. 17, 2009

(51) Int. Cl.
*A61N 5/00* (2006.01)
*G21G 5/00* (2006.01)
*B32B 9/04* (2006.01)
*B32B 13/04* (2006.01)
*H01L 21/02* (2006.01)
*H01L 21/78* (2006.01)
*H01L 21/268* (2006.01)

(52) U.S. Cl.
CPC .......... *H01L 21/268* (2013.01); *H01L 21/0201* (2013.01); *H01L 21/78* (2013.01)
USPC ................. 428/446; 250/492.2; 257/E21.347

(58) Field of Classification Search
CPC .................. H01L 21/02002; H01L 21/02005; H01L 21/268; H01L 21/78; H01L 21/67288
USPC ................. 428/446; 250/492.2; 257/E21.347
See application file for complete search history.

(56) References Cited

U.S. PATENT DOCUMENTS

| 4,131,487 | A | * | 12/1978 | Pearce et al. .................... 438/473 |
| 4,729,971 | A | * | 3/1988 | Coleman ........................ 438/462 |
| 6,049,443 | A | | 4/2000 | Grill et al. |
| 7,160,784 | B2 | | 1/2007 | Yamazaki et al. |
| 2002/0119633 | A1 | | 8/2002 | Yamazaki et al. |
| 2005/0173387 | A1 | * | 8/2005 | Fukuyo et al. ............ 219/121.67 |
| 2007/0037321 | A1 | * | 2/2007 | Higashino et al. ............. 438/109 |
| 2007/0170159 | A1 | * | 7/2007 | Fukumitsu ................ 219/121.69 |

FOREIGN PATENT DOCUMENTS

| JP | 57-102008 | * | 6/1982 | ............ H01L 21/02 |
| JP | 2001274048 | | 10/2001 | |
| JP | WO/2005/007335 | * | 1/2005 | ............. B23K 26/03 |

OTHER PUBLICATIONS

Certified English translation of JP 57-102008, 1982, 17 pages.*
Hamamatsu, Stealth Dicing Technology and Applications, Technical Information, Mar. 2005.

* cited by examiner

*Primary Examiner* — Jonathan Langman
(74) *Attorney, Agent, or Firm* — Dicke, Billig & Czaja, PLLC

(57) ABSTRACT

A semiconductor device includes a wafer having a first surface opposite a second surface, and at least one laser irradiated region between the first and second surfaces. The laser irradiated region includes a laser-induced stress that is configured to minimize curvature of at least one of the first and second surfaces.

12 Claims, 13 Drawing Sheets

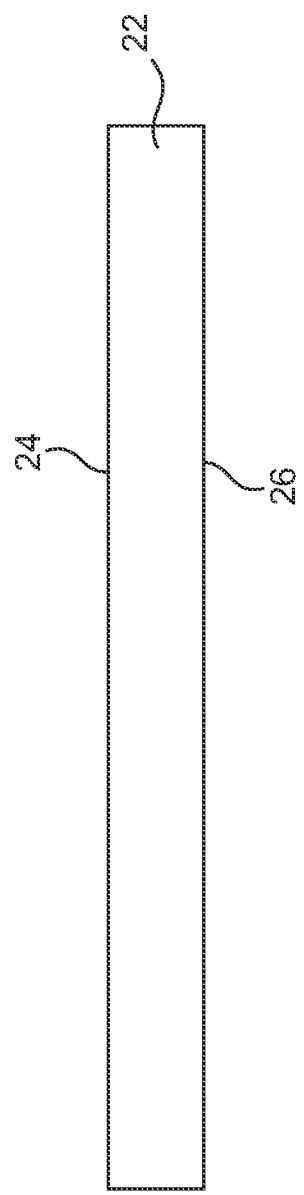

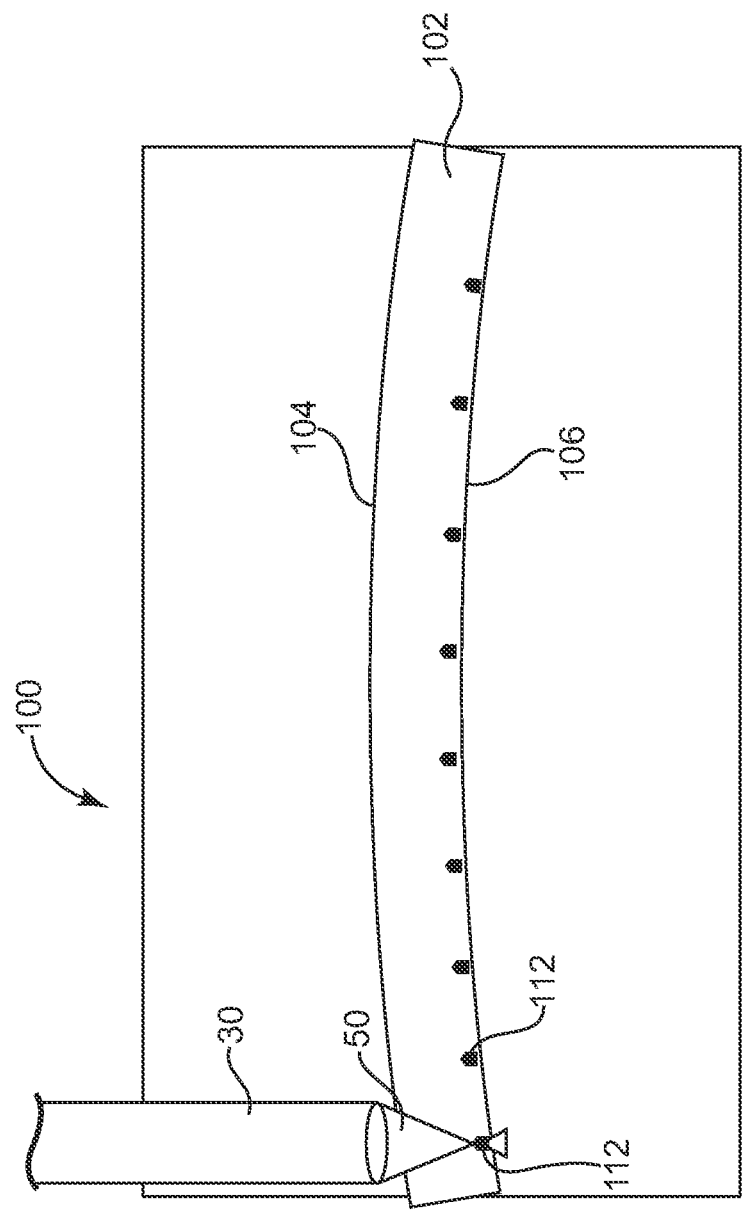

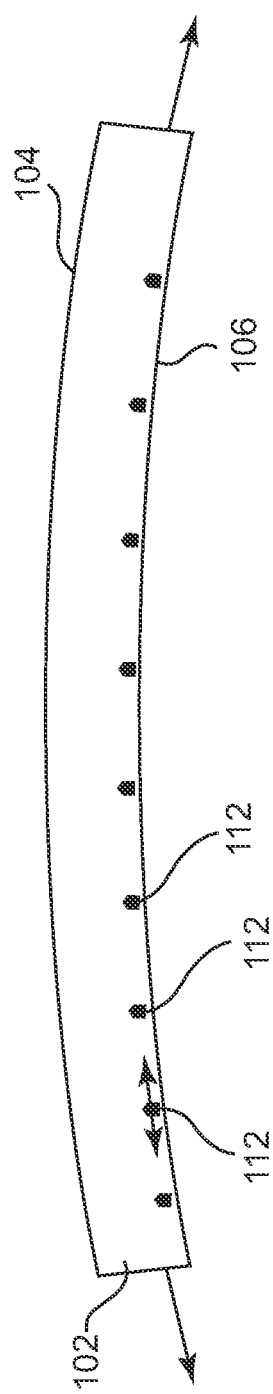
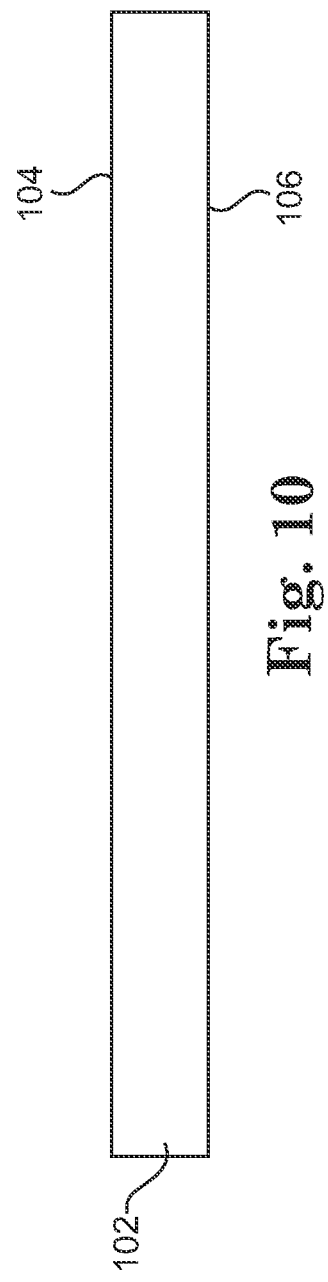

SEMICONDUCTOR DEVICE

BACKGROUND

Market demand for smaller and more functional electronic devices has driven the development of semiconductor devices, including semiconductor packages, and entire systems disposed on a chip. Some electronic devices, such as cellular telephones, employ a variety of design-specific electronic components. The space available inside the electronic devices is limited, particularly as the electronic devices are made smaller. Other electronic devices, such as are employed in the automotive industry, are power devices that operate in demanding environments.

Semiconductor chips, whether provided as a package or as a stand alone chip, are fabricated on a wafer. The chips are fabricated on the wafer starting with front-end processing in a layer-by-layer manner until the chips are back-end processed to include interconnects to the outside world. The wafer could warp at any step in processing. Warped wafers limit chip yield and present many challenges during chip processing that undesirably increases the unit cost of the chips.

For these and other reasons there is a need for the present invention.

SUMMARY

One aspect provides a semiconductor device including a wafer having a first surface opposite a second surface, and at least one laser irradiated region between the first and second surfaces. The laser irradiated region includes a laser-induced stress that is configured to minimize curvature of at least one of the first and second surfaces.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 is a cross-sectional view of a semiconductor wafer including internal laser-induced stress regions that minimize surface curvature on the wafer according to one embodiment.

FIG. 8 is a cross-sectional view of a system employed to repair convex curvature in a semiconductor wafer according to another embodiment.

FIG. 9 is a cross-sectional view of a region of the semiconductor wafer shown in FIG. 8 including internal laser-induced stress gradients according to one embodiment.

FIG. 10 is a cross-sectional view of the semiconductor wafer shown in FIG. 8 having the surface curvature repaired.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a system and method for repairing a warped surface of a semiconductor wafer. Semiconductor wafers are fabricated or built in a layer-by-layer assembly. Each individual layer induces some level of stress in the overall wafer, and it is possible that individual layers create a stress gradient within the semiconductor wafer that results in the wafer having undesirable curvature. Wafers with curvature are more difficult to process and often limit the yield of semiconductor chips that can be usefully diced from the wafer. Consequently, warped semiconductor wafers increase the unit cost of semiconductor chips and are undesirable for this and other reasons. Embodiments provide a system and method for repairing warpage in semiconductor wafers that result in the minimization or elimination of surface curvature on the semiconductor wafer.

Other embodiments provide semiconductor wafers suited for certain power applications where the wafer includes a relatively thick backside metal layer. Processing of the wafer and/or the attachment of the backside metal layer can possibly create warpage on one or more surfaces of the semiconductor wafer. Embodiments provide a direct and efficient system and method for correcting semiconductor wafer warpage on wafers with metal backsides that are useful in power applications.

Figure 1:
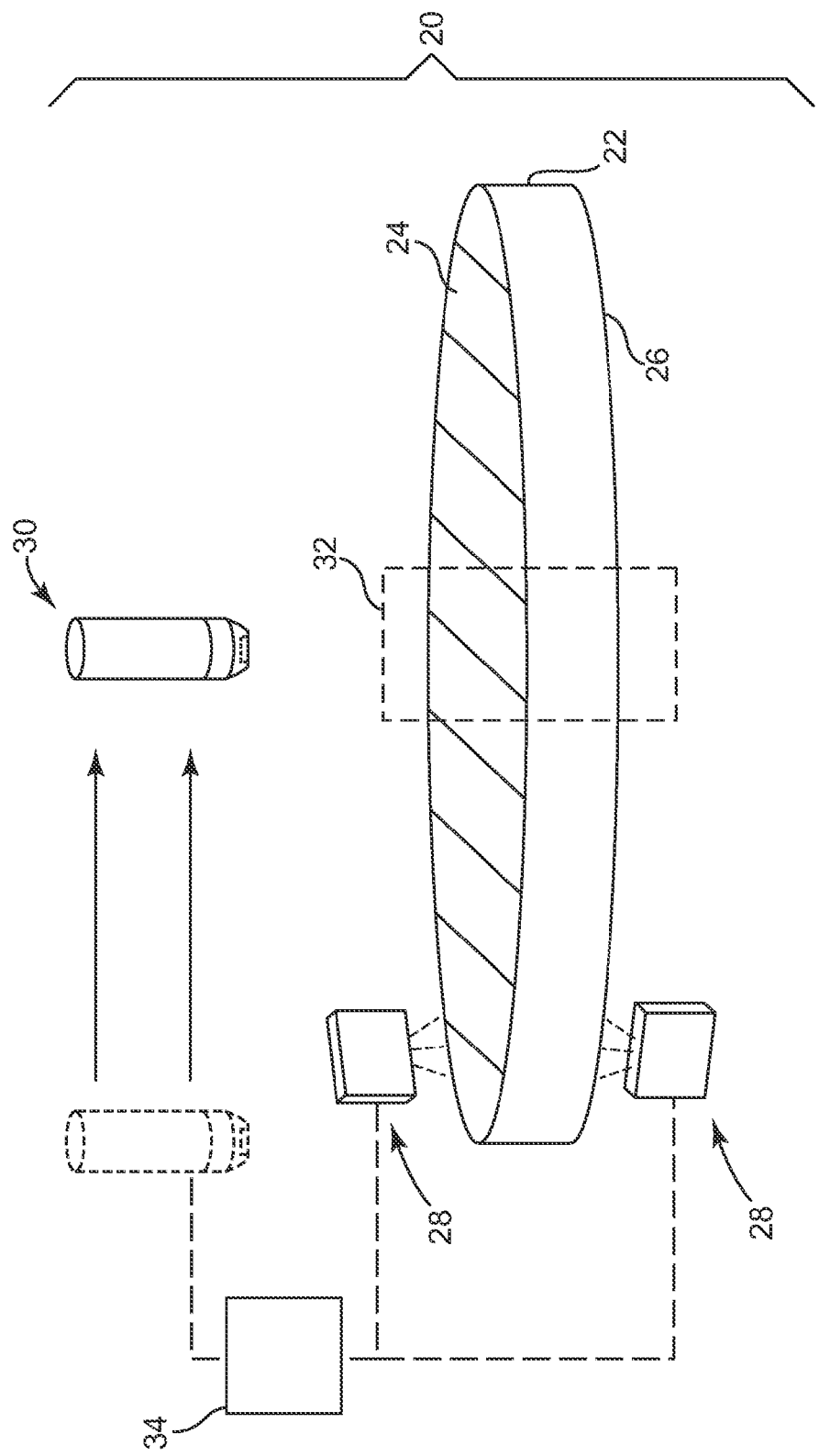
FIG. 1 is a perspective view of a system for fabricating semiconductor device wafers having minimal surface curvature according to one embodiment.

FIG. 1 is a perspective view of a system 20 for fabricating semiconductor device wafers 22 having minimal surface curvature according to one embodiment. System 20 includes a wafer 22 having a first major surface 24 opposite a second major surface 26, an optical scanning assembly 28 configured to sense curvature along the first and second surfaces 24, 26, and a laser 30 communicating with optical scanning assembly 28. In one embodiment, optical scanning assembly 28 locates a region 32 of curvature on wafer 22 and communicates the located region 32 to laser 30 by communicating through a controller 34. Laser 30 is configured to be selectively moved/guided to the located region 32, irradiate region 32, and induce a stress inside wafer 22 within region 32 that corrects the curvature along one or both of the surfaces 24, 26 of wafer 22.

In one embodiment, wafer 22 is fabricated or grown from a monocrystalline silicon source into a wafer cylinder that is sliced into wafers. Wafer 22 includes any suitable wafer configured for fabrication/processing to include a plurality of semiconductor chips or dies.

Optical scanning assembly 28 includes surface analysis systems or other optical scanners configured to measure, analyze, and quantify surface characteristics of wafer 22. In one embodiment, optical scanning assembly 28 includes a vision system suited for use in fabrication of semiconductor wafers. One suitable supplier of such vision systems is JLI vision a/s, Denmark. In one embodiment, laser 30 is configured to measure, analyze, and quantify surface characteristics of wafer 22 prior to laser irradiating wafer 22.

In one embodiment, laser 30 includes a neodymium-doped yttrium aluminum garnet (Nd:YAG) solid state laser, a $CO_2$ or gas laser, a diode laser, or other suitable high energy source. In one embodiment, laser 30 is a Nd:YAG laser having a power between 5-100 watts and operates at a speed between 100-300 mm/s, although other suitable lasers operated at other powers and transport speeds are also acceptable. In general the Nd:YAG laser emits light at a wavelength of between about 1032-1064 nanometers in the infrared spectrum, although transitions near the 940, 1120, 1320, and 1440 nanometer range are present. Laser 30 may be pulsed at high repetition rates or operated continuously. One suitable Nd:YAG laser is available from Han's Laser Technology Company, Houston, Tex.

In one embodiment, controller 34 includes a computer operated controller having memory and operating software in a manner that is configured to communicate with optical scanning assembly 28 in identifying and storing information related to the location of the sensed curvature on wafer 22. Suitable controllers include electronic controllers operating an accessible read/write memory, for example a flash memory or other suitable memory. Other suitable controllers for electrical communication with laser 30 are acceptable and known to those of skill in the art.

Figure 2:
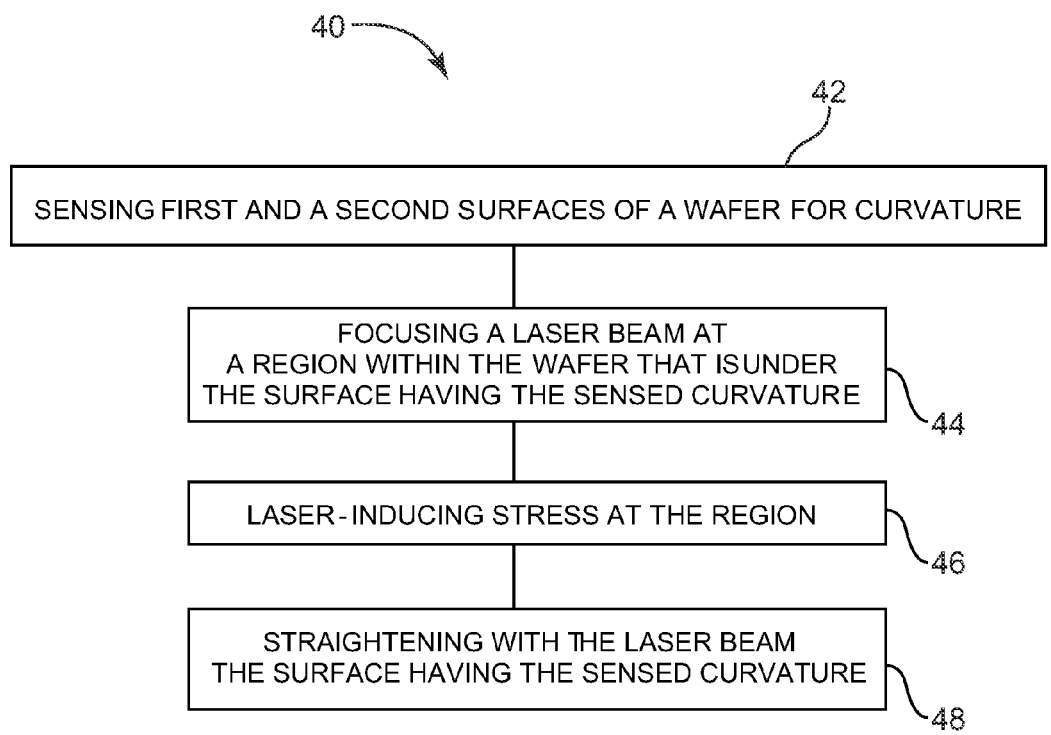
FIG. 2 is a block diagram of a process according to one embodiment that is implemented by the system of FIG. 1.

FIG. 2 is a block diagram 40 of a process according to one embodiment that is implemented by the system 20 shown in FIG. 1. Block diagram 40 provides at 42 sensing first and second surfaces 24, 26 of wafer 22 to detect curvature on wafer 22. Block diagram 40 provides at 44 for focusing a laser beam directed from laser 30 at region 32 within wafer 22 that is under one of the surface 24, 26. Block diagram 40 provides at 46 laser inducing stress at region 32. Block diagram 40 provides at 48 for straightening with the laser beam the surface having the sensed curvature in repairing the curvature of wafer 22. System 20 may be operated with other process methodologies when repairing surface curvature of wafer 22.

Figure 3:
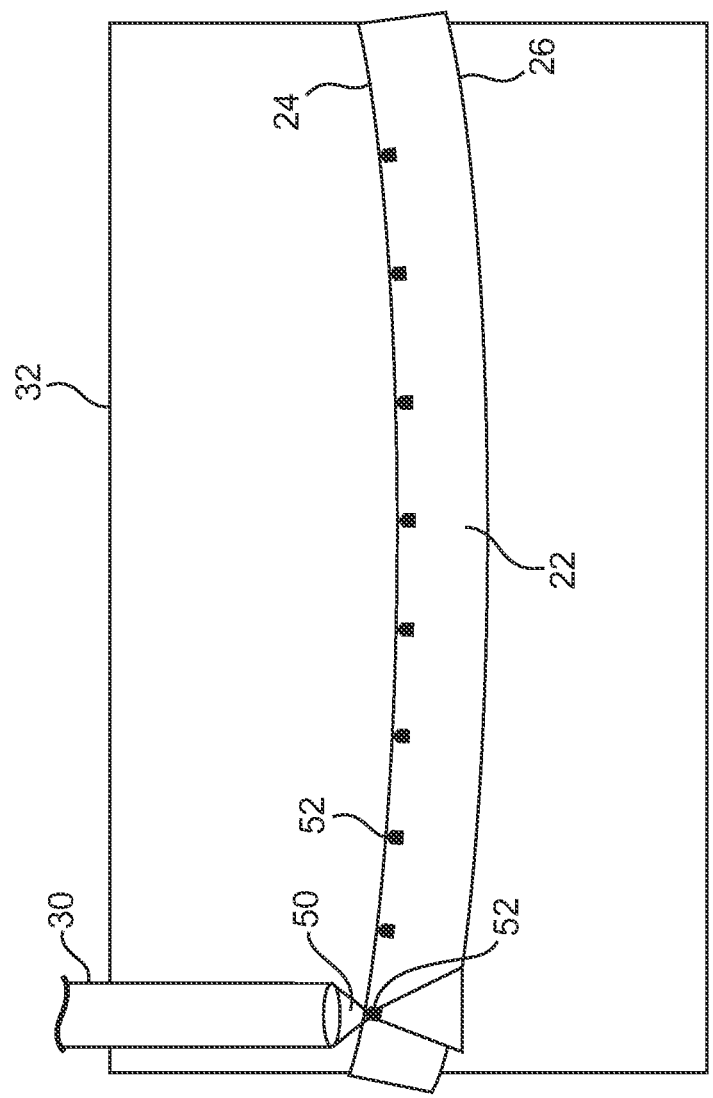
FIG. 3 is a cross-sectional view of a laser beam focused in a region within a wafer according to one embodiment.

FIG. 3 is a cross-sectional view of region 32 of wafer 22. The cross-sectional views of FIGS. 3, 4, 7-10, and 13-14 do not include sectioning lines in order to better illustrate the region in the wafer at which the laser beam induces stress. System 20 (FIG. 1) has been employed to identify curvature within region 32. Controller 34 is operable to move laser 30 into region 32 and initiate laser processing within region 32. A laser beam 50 from laser 30 is focused into wafer 22 between surfaces 24, 26 to irradiate points 52 internal to wafer 22. The internal points 52 (or focal points 52 of beam 50) are amorphousized or partly amorphousized by the focused laser beam 50.

In this specification, amorphousized means a structure of the wafer that has less crystallinity than the wafer had before it was laser irradiated. The wafer generally starts with some level of crystallinity, is laser irradiated to have less crystallinity, and is thus amorphousized.

In the embodiment illustrated by FIG. 3, surface 24 provides a generally concave surface and laser beam 50 is focused at point 52 inside wafer 22 and adjacent to surface 24. Points 52 become amorphousized by a laser-induced stress that increases the local volume around point 52 to stress surface 24. The increase in the volume (corresponding to a decrease in density) in the wafer material in region 32 induces stress locally adjacent to surface 24 that stretches surface 24 to repair the concave curvature.

In one embodiment, wafer 22 includes a monocrystalline silicon and the laser irradiated point 52 provides a polycrystalline silicon region having a local density that is lower than a density of non-laser irradiated portions of monocrystalline silicon wafer 22.

In one embodiment, wafer 22 includes a silicon substrate and a polymeric dielectric coupled to the silicon substrate. The observed curvature can be located in either the silicon or the polymeric dielectric. The laser irradiation is employed to effectively repair the observed curvature in one or the other of the silicon substrate and the polymeric dielectric.

Figure 4:
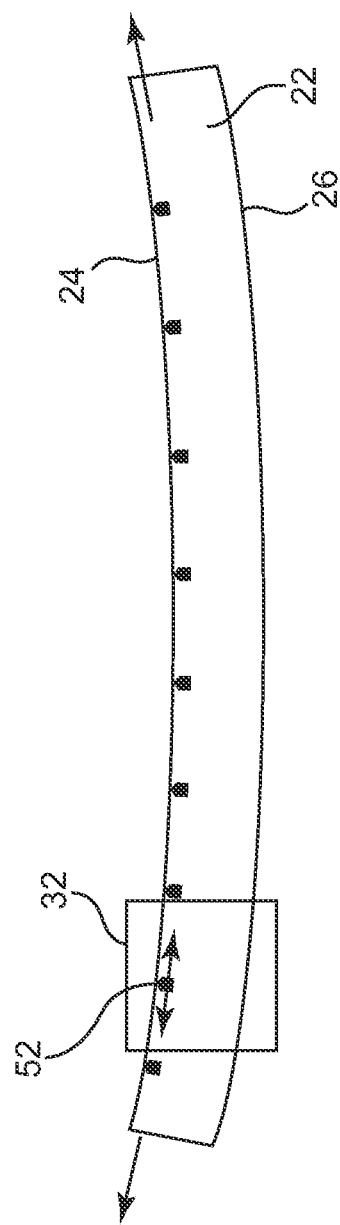
FIG. 4 is a cross-sectional view of a region having laser-induced internal stress that minimizes curvature at the surface of the wafer.

FIG. 4 is a cross-sectional view of wafer 22 showing region 32. Region 32 has been laser processed to provide internal points of stress 52 that stretch surface 24 laterally, as indicated by the arrows. In one embodiment, the laser induced stress from laser beam 50 (FIG. 3) increases a local volume within wafer 22 (by amorphousizing the wafer material) to straighten surface 24. In one embodiment, the laser-induced stress has a magnitude of between about $10$-$80 \times 10^8$ dyne/$cm^2$, although other levels of laser induced stress are also possible.

Figure 5:
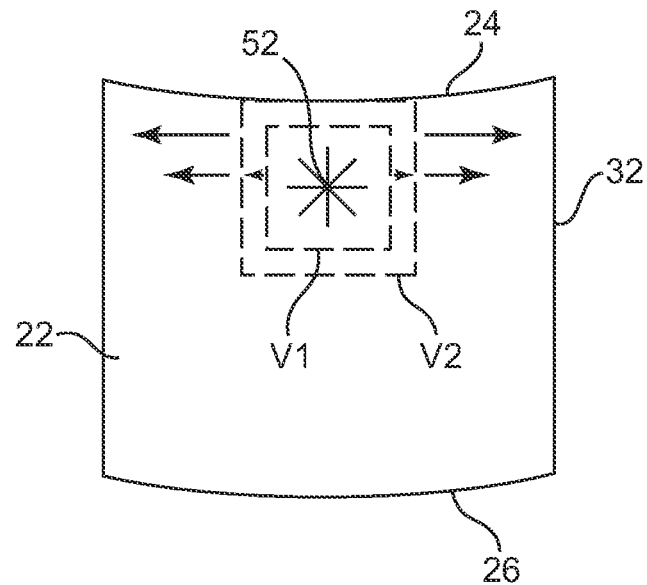
FIG. 5 is a schematic view of a region internal to a semiconductor wafer after volumetric changes in the region have been laser-induced.

FIG. 5 is a sectional schematic view of region 32. Point 52 has been laser irradiated to induce stress that laterally stretches region 32 and stretches surface 24. In one embodiment, region 32 is characterized by an initial local volume V1 surrounding point 52 that is stressed by laser beam 50 to have a laser-induced volume increase to volume V2 of between about 1-5 percent. In one embodiment, the density is decreased and the volume is increased in region 32 by about 2 percent to cause a stress at point 52 that straightens surface 24. In one embodiment, region 32 is relatively thick as compared to the penetration depth of laser beam 50. The focus depth of laser beam 50 is selectively adjusted between surfaces 24, 26 to laser-induce a stress at any point throughout the depth of wafer 22.

Figure 6:
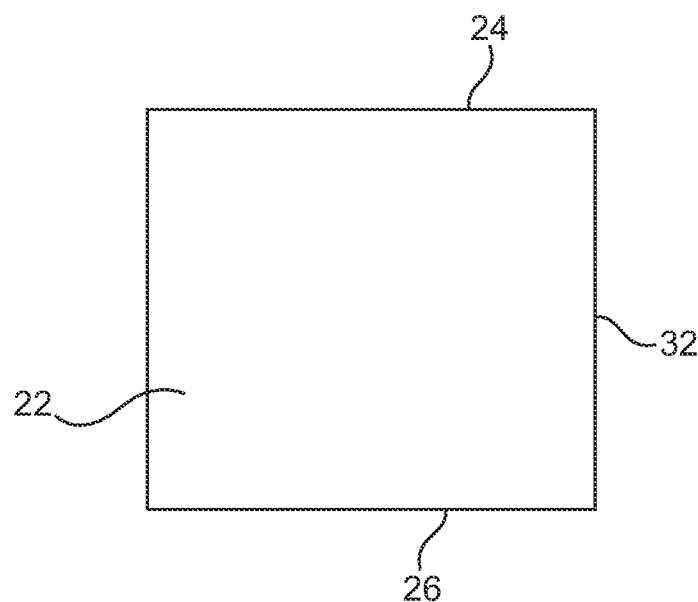
FIG. 6 is a schematic view of a region of the wafer after the surface curvature has been repaired.

FIG. 6 is a schematic view of region 32 after laser processing. In one embodiment, local portions of wafer 22 are exposed to a series of scans by laser beam 50. The repeated scans of laser beam 50 through wafer 22 induces stress between surfaces 24, 26 in a manner that is selected/controlled to planarize or reduce curvature at one or both of surfaces 24, 26. FIG. 6 illustrates that region 32 has been straightened by laser-induced stress in wafer 22, as described above.

FIG. 7 is a cross-sectional view of wafer 22 after processing as described above and showing a macroscopic edge/side view of the straightened surfaces 24, 26 of wafer 22.

FIG. 8 is a cross-sectional view of a system 100 employed to repair convex curvature in a semiconductor wafer 102 according to another embodiment. System 100 is similar to system 20 and employs laser 30 to correct the convex curvature on surface 104 that is opposite major surface 106. In one embodiment, laser beam 50 is projected incident to surface 104 and focused at a point 112 that is adjacent to surface 106. The wavelength of laser beam 50 is selected to transmit through a majority of the thickness of wafer 102 and focus at point 112 that is aligned with a locally identified curved region/area. The localized beam 50 is formed at an extremely high peak power density and focused at point 112. Focusing at point 112 causes the laser beam to provide high absorption at localized points in wafer 102. Embodiments provide optimization of laser beam 50 to induce a stress along selected points 112 in a manner that minimizes or eliminates damage to surfaces 104, 106 of wafer 102 while straightening the surfaces and reducing the detected curvature. Beam 50 transmits through surfaces 104, 106 and does not damage the electrical function of surfaces 104, 106. As noted above, volumetric expansion occurs by the localized polycrystallization of the wafer 102 that induces a stress adjacent to a selected one of the surface 104, 106 to straighten the surfaces and reduce the detected curvature.

FIG. 9 is a cross-sectional view of wafer 102. Laser beam 50 is traversed across the length and width of wafer 102 to induce stress at points 112 that is configured to straighten surface 104, 106. The material of wafer 102 along surface 106 that has been stress-induced stretches to reverse the curvature in surfaces 104, 106. In one embodiment, multiple scans of laser 30 (FIG. 8) are directed into wafer 102 to selectively induce stress along surface 106 without damaging surfaces 104, 106 of wafer 102.

FIG. 10 is a cross-sectional view of wafer 102 after laser-induced straightening by laser 30 (FIG. 8). Laser 30 has induced stress along surface 106 that was selected and controlled to straighten both surfaces 104, 106.

Figure 11:
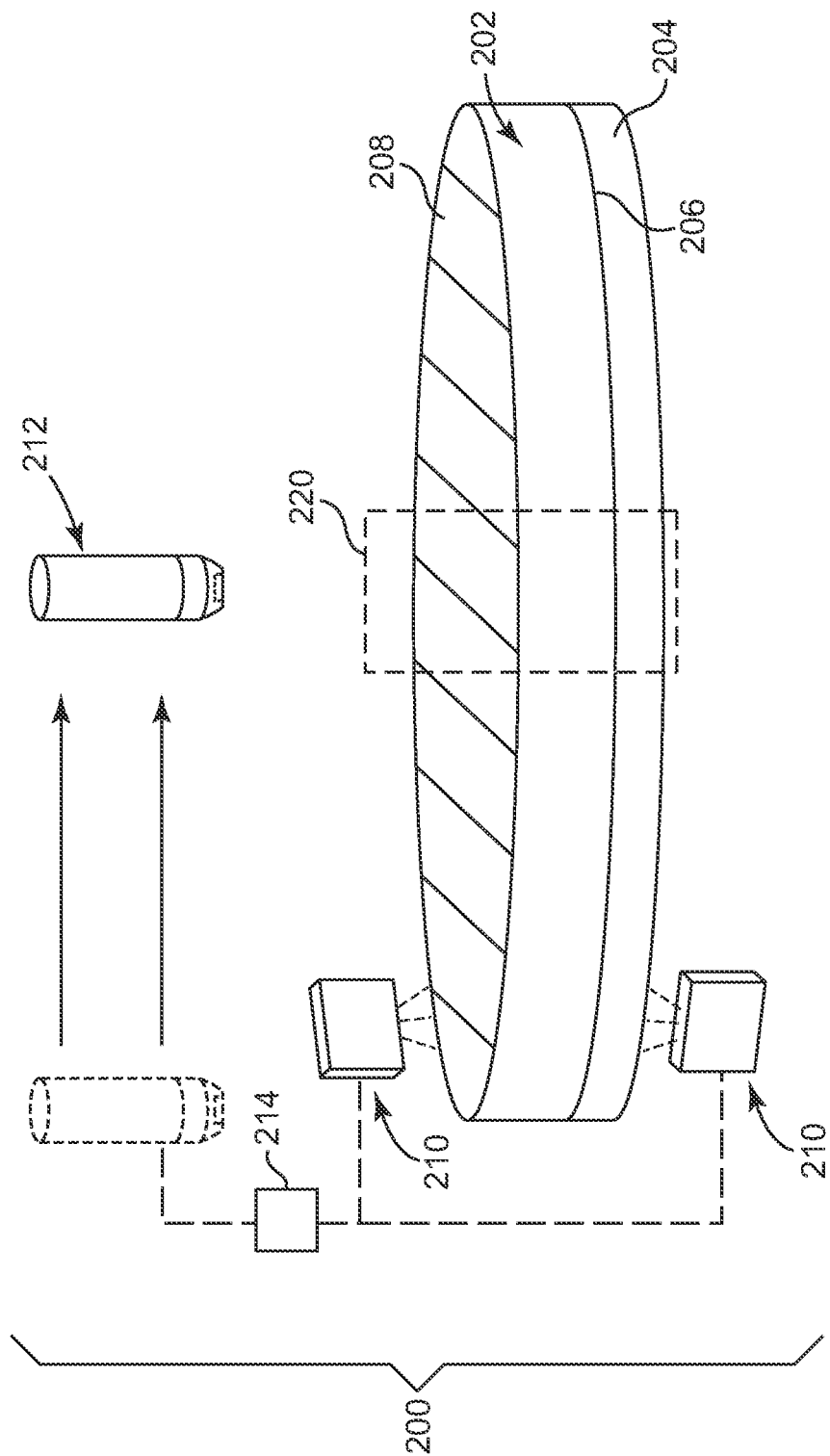
FIG. 11 is a perspective view of a system for fabricating semiconductor device wafers having minimal surface curvature, where the wafer is suited for power applications and includes a metallized backside.

FIG. 11 is a perspective view of a system 200 for fabricating semiconductor device wafers 202 having minimal surface curvature, where the wafer 202 is suited for power applications and includes a metal layer 204 attached to a backside 206.

Wafer 202 can be fabricated to provide chips that are usefully employed in power applications and have a metal layer 204 attached to backside 206. Upon singulation, each chip separated from wafer 202 has an electrically conductive backside provided by metal layer 204. It has been observed that processing wafer 202 to include metal layer 204 can lead to curvature along a front side 208 or along backside 206 of wafer 202. Embodiments of system 200 provide for correcting or reducing curvature in surfaces 206, 208.

In one embodiment, system 200 includes an optical scanning assembly 210 electrically communicating with laser 212 through controller 214. Optical scanning system 210 is similar to optical scanning system 28 (FIG. 1) and is employed to detect and identify curvature in one or more regions 220 along wafer 202. The location of curvature is communicated to laser 212 through controller 214. By the embodiments described above, laser 212 is operated to induce a stress within portions of wafer 202 that corrects or reverses the wafer curvature that is detected by optical scanning system 210.

Figure 12:
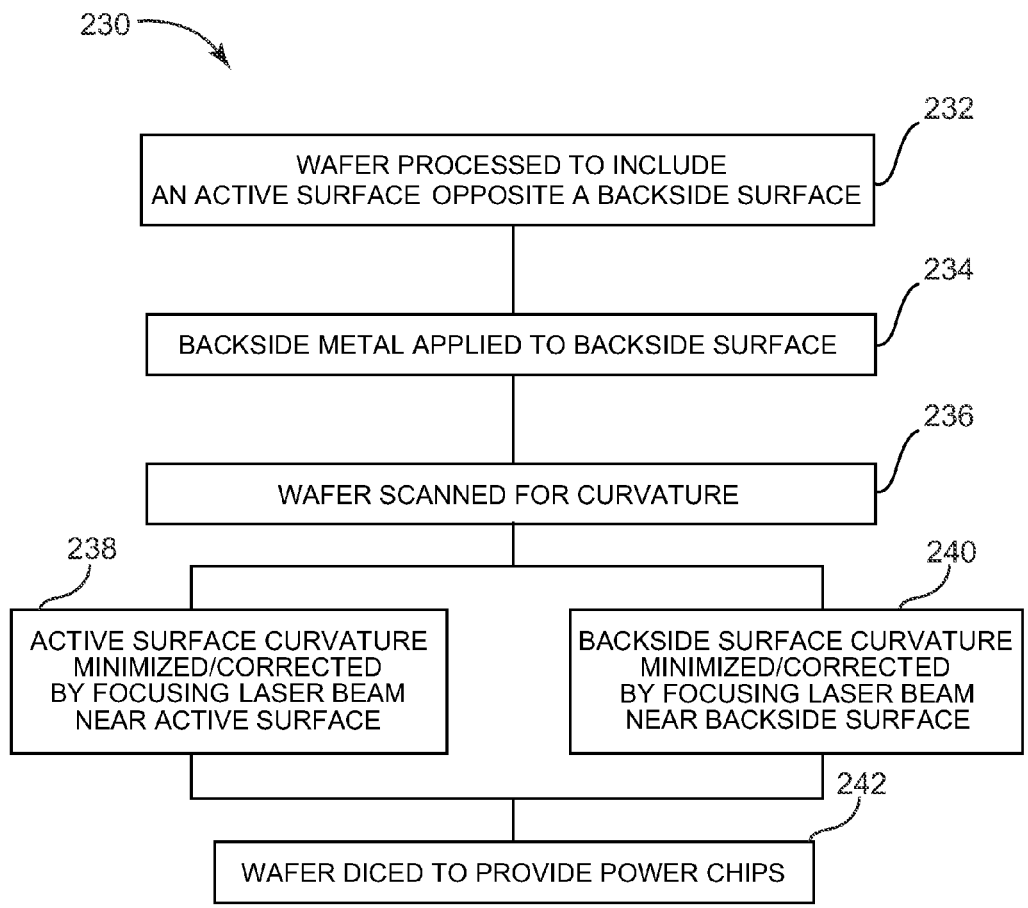
FIG. 12 is a block diagram of a process according to one embodiment that is implemented by the system shown in FIG. 11 to provide highly planar wafers useful in power applications.

FIG. 12 is a block diagram 230 of a process according to one embodiment that is implemented by system 200 (FIG. 11) to provide highly planar wafers useful in power applications. Block diagram 230 provides at 232 the processing of wafer 202 to include active surface 208 and backside surface 206. Backside metal layer 204 is applied to backside surface 206 at 234. Wafer 202 is optically scanned for curvature at 236, for example by employing optical scanning assembly 210.

In one embodiment, curvature is detected along active surface 208 and process 238 is provided to minimize curvature along active surface 208 by focusing a laser beam internal to wafer 208 near active surface 208.

In another embodiment, process 240 is provided in which curvature is detected along backside surface 206 and the curvature is minimized/corrected by focusing a laser beam near backside surface 206.

Employing the methodologies described above, local regions of internal induced stress are formed in wafer 202 with a high energy source to volumetrically or physically alter wafer 202 to minimize or correct the curvature along one or more surface of wafer 202. After wafer 202 is straightened out by reversing or correcting the observed curvature, wafer 202 is diced at process 242 to provide chips useful in power applications. In particular, each chip includes a portion of metal layer 204 that is suited for electrically connecting the chips in power assemblies.

Figure 13:
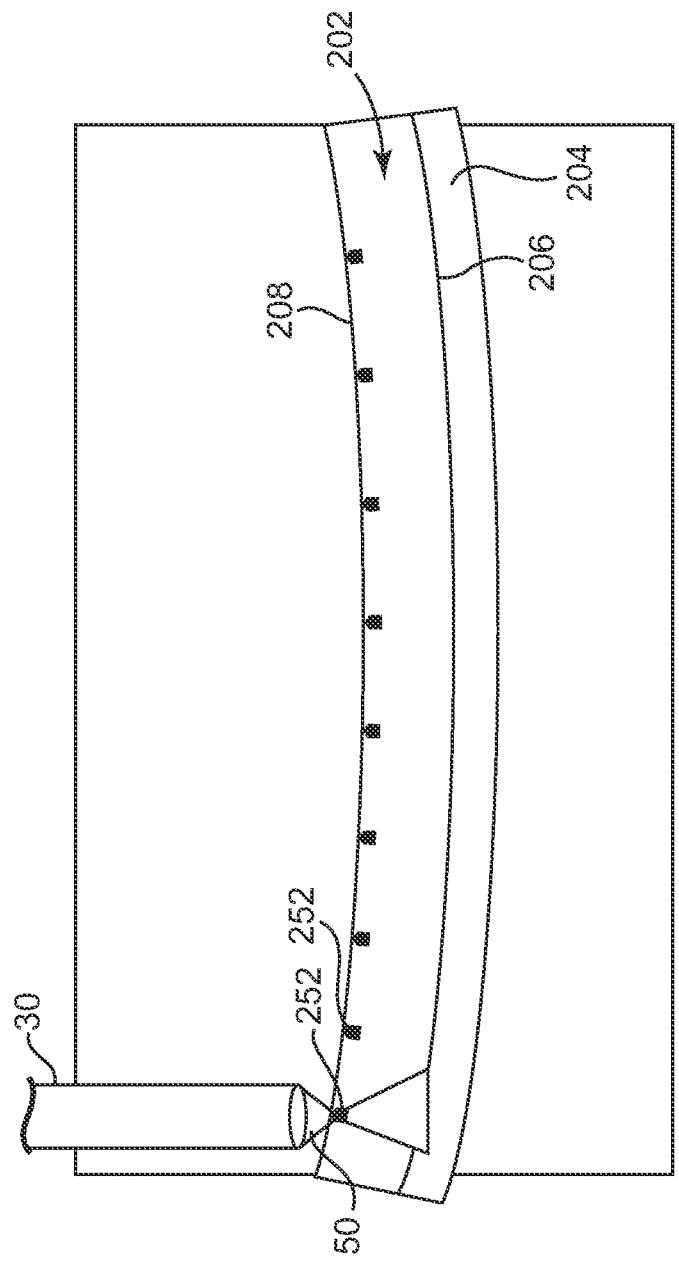
FIG. 13 is a cross-sectional view of a laser system employed to correct concave curvature at a surface of a semiconductor power wafer according to one embodiment.

FIG. 13 is a cross-sectional view of laser system 200 (FIG. 11) employed to correct concave curvature along surface 208 of semiconductor power wafer 202 according to one embodiment. Active surface 208 includes concave curvature and laser 30 is employed to minimize/correct/reverse the detected concave curvature. In one embodiment, laser 30 is activated to focus laser beam 50 at a point 252 inside wafer 202 adjacent to active surface 208. Local volumes of material in wafer 202 are expanded after the laser-induced stress is initiated at points 252. The stress at points 252 straightens out surface 208. It is to be understood that multiple scans of laser beam 50 may be provided throughout wafer 202 to provide a depth and breadth of laser induced stresses inside wafer 202.

Figure 14:
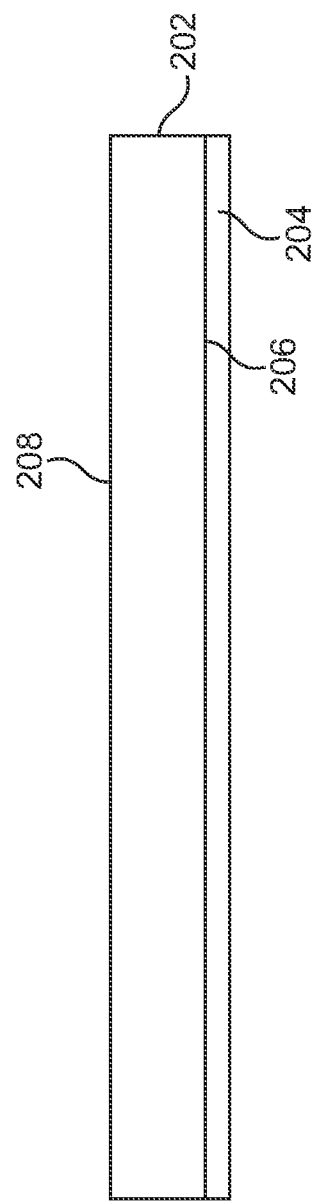
FIG. 14 is a cross-sectional view of a semiconductor wafer with a metallized backside after having surface curvature corrected.

FIG. 14 is a cross-sectional view of wafer 202 having active surface 208 straightened by laser 30 (FIG. 13). Embodiments described herein provide a solution for salvaging warped power wafers by laser inducing volumetric stress inside of wafer 202 to straighten surfaces 206, 208. To this end, wafer 202 including metal layer 204 is straightened as described above and suited for further processing including backend wiring and dicing. The straightened wafer illustrated in FIG. 14 is easier to handle, is compatible with wafer handling equipment, and provides increased semiconductor chip yield.

Figure 15:
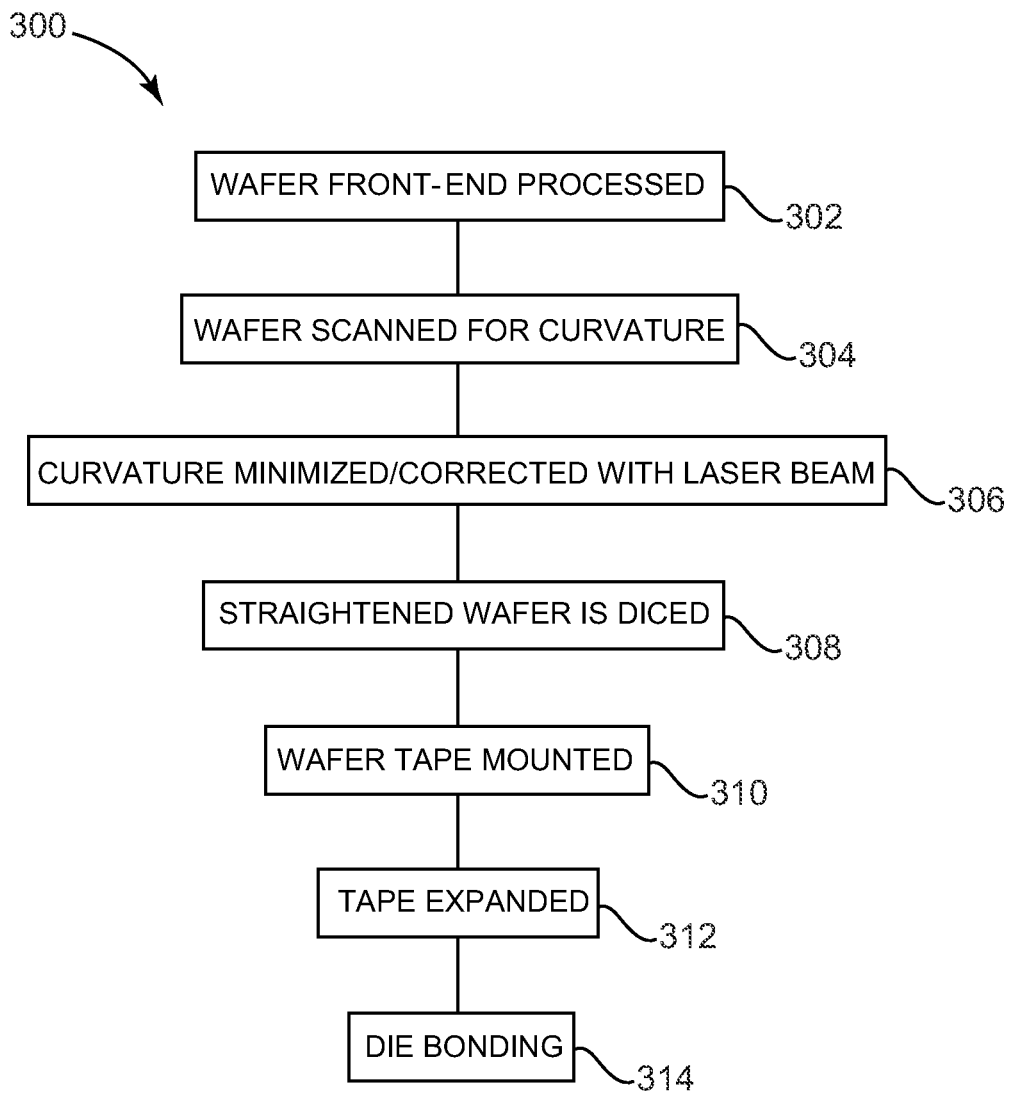
FIG. 15 is a block diagram of a method for repairing a warped surface on a semiconductor wafer prior to dicing the wafer into semiconductor chips according to one embodiment.

FIG. 15 is a block diagram 300 of a method for repairing a warped surface on a semiconductor wafer prior to dicing the wafer into semiconductor chips according to one embodiment. Block diagram 300 includes a wafer front-end process at 302 and scanning the wafer for curvature at 304. By employing the system and methodologies described above, the observed curvature is minimized/corrected through laser-induced stress processing at process 306. The straightened wafer is diced at 308. In one embodiment, the diced wafer is tape mounted at 310 in which the diced dies are secured to a surface of a transport tape. In some embodiments, the taped carrier is expanded at 312 to spatially separate the singulated dies. Process 314 provides for die bonding the singulated dies into a suitable electronic device.

Aspects described above provide an elegant and cost effective solution for correcting curvature in semiconductor wafers. Embodiments provide for straightening concave curvature in semiconductor wafers by focusing a laser beam internal to the semiconductor wafer and inducing a stress that stretches a boundary surface of the wafer. Other embodiments provide for straightening a convex curvature of a wafer by focusing a laser beam internal to the wafer and adjacent to one or both surfaces. The embodiments described above provide for straightening curved semiconductor wafers, including wafers having a metallized backside, thus salvaging the wafer and increasing semiconductor chip yield.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific methodologies of minimizing semiconductor wafer warp as discussed herein. Therefore, it is intended that this invention be limited only by the claims and the equivalents thereof.

What is claimed is:

1. A semiconductor device comprising:
   a wafer comprising a plurality of chips and a first surface opposite a second surface, the first surface being an active surface to provide an electrical function;
   at least one laser irradiated region adjacent to and parallel to the first surface, the laser irradiated region comprising a laser-induced stress that is configured to increase a chip yield of the wafer by straightening at least one of the first and second surfaces in a region of the wafer where curvature was sensed,
   wherein the laser irradiated region comprises a plurality of spaced apart points that are amorphousized or partly amorphousized via a series of scans by a laser beam, the plurality of spaced apart points including a plurality of spaced apart points across a length of an area defined by the laser irradiated region and a plurality of spaced apart points across a width of the area such that spaced apart points are throughout the area; and
   at least one further laser irradiated region adjacent the second surface, the further laser irradiated region comprising a laser-induced stress that is configured to straighten at least one of the first and second surfaces.

2. The semiconductor device of claim 1, wherein the wafer comprises a silicon wafer and the laser irradiated region comprises polycrystalline silicon.

3. The semiconductor device of claim 2, wherein the wafer comprises monocrystalline silicon and the laser irradiated polycrystalline silicon region comprises a density that is lower than a density of a non-laser irradiated portion of the monocrystalline silicon.

4. The semiconductor device of claim 1, wherein the laser-induced stress comprises a magnitude of between about $10\text{-}80 \times 10^8$ dyne/cm$^2$.

5. The semiconductor device of claim 1, wherein the wafer comprises a silicon substrate and a polymeric dielectric, and the laser irradiated region is located in one of the silicon substrate and the polymeric dielectric.

6. The semiconductor device of claim 1, further comprising:
   a metal layer attached to the second surface.

7. A semiconductor device comprising:
   a wafer comprising an active surface to provide an electrical function, the active surface opposite a backside surface, the wafer comprising a plurality of dies;
   a laser irradiated region adjacent to and parallel to the active surface, the laser irradiated region comprising a laser-induced stress that is configured to increase a die yield of the wafer by straightening at least one of the active surface and the backside surface in a region of the wafer where curvature was sensed,
   wherein the laser irradiated region comprises a plurality of spaced apart points that are amorphousized or partly amorphousized via a series of scans by a laser beam, the plurality of spaced apart points including a plurality of spaced apart points across a length of an area defined by the laser irradiated region and a plurality of spaced apart points across a width of the area such that spaced apart points are throughout the area; and
   at least one further laser irradiated region adjacent the backside surface, the further laser irradiated region comprising a laser-induced stress that is configured to straighten at least one of the active surface and the backside surface.

8. The semiconductor device of claim 7, wherein the wafer comprises a silicon wafer and the laser irradiated region comprises polycrystalline silicon.

9. The semiconductor device of claim 8, wherein the wafer comprises monocrystalline silicon and the laser irradiated polycrystalline silicon region comprises a density that is lower than a density of a non-laser irradiated portion of the monocrystalline silicon.

10. The semiconductor device of claim 7, wherein the laser-induced stress comprises a magnitude of between about $10\text{-}80 \times 10^8$ dyne/cm$^2$.

11. The semiconductor device of claim 7, wherein the wafer comprises a silicon substrate and a polymeric dielectric, and the laser irradiated region is located in one of the silicon substrate and the polymeric dielectric.

12. The semiconductor device of claim 7, further comprising:
   a metal layer attached to the backside surface.

* * * * *